United States Patent
Jung et al.

(10) Patent No.: US 11,139,668 B2
(45) Date of Patent: Oct. 5, 2021

(54) CHARGING METHOD AND APPARATUS OPTIMIZED BASED ON ELECTROCHEMICAL MODEL

(71) Applicant: SAMSUNG ELECTRONICS CO., LTD., Suwon-si (KR)

(72) Inventors: Daeryong Jung, Seoul (KR); Duk Jin Oh, Seoul (KR); Ju Wan Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 357 days.

(21) Appl. No.: 16/275,689

(22) Filed: Feb. 14, 2019

(65) Prior Publication Data

US 2020/0103469 A1    Apr. 2, 2020

(30) Foreign Application Priority Data

Oct. 1, 2018    (KR) .................. 10-2018-0117009

(51) Int. Cl.
*H02J 7/00* (2006.01)
*G01R 31/392* (2019.01)
*G01R 31/382* (2019.01)
*H01M 10/42* (2006.01)
*G01R 31/367* (2019.01)

(52) U.S. Cl.
CPC .......... *H02J 7/007* (2013.01); *G01R 31/367* (2019.01); *G01R 31/382* (2019.01); *G01R 31/392* (2019.01); *H01M 10/425* (2013.01); *H01M 2010/4271* (2013.01); *H01M 2010/4278* (2013.01)

(58) Field of Classification Search
CPC ........................................... H02J 7/007
USPC ............................................. 320/134
See application file for complete search history.

(56) References Cited

U.S. PATENT DOCUMENTS

| | | |
|---|---|---|
| 8,054,038 B2 | 11/2011 | Kelty et al. |
| 8,117,857 B2 | 2/2012 | Kelty et al. |
| 8,163,410 B2 | 4/2012 | Fulop et al. |
| 8,508,191 B2 | 8/2013 | Kim et al. |
| 8,618,775 B2 | 12/2013 | Hermann et al. |
| 8,624,560 B2 | 1/2014 | Ungar et al. |
| 8,961,203 B2 | 2/2015 | Lee |
| 8,972,213 B2 | 3/2015 | Zhang et al. |
| 9,153,991 B2 | 10/2015 | Chaturvedi et al. |
| 9,651,628 B2 * | 5/2017 | Mattisson ............ G01R 31/392 |
| 2009/0104510 A1 * | 4/2009 | Fulop ................. H02J 7/00 429/50 |
| 2012/0210812 A1 | 8/2012 | Schmidt |

(Continued)

FOREIGN PATENT DOCUMENTS

| | | |
|---|---|---|
| JP | 2016-24170 A | 2/2016 |
| JP | 2016-195495 A | 11/2016 |

(Continued)

*Primary Examiner* — Jerry D Robbins
(74) *Attorney, Agent, or Firm* — NSIP Law

(57) ABSTRACT

Disclosed is a charging method and apparatus which is optimized based on an electrochemical model, the charging method includes estimating an internal state of a battery, determining a charging limitation condition corresponding to a plurality of charging areas based on the internal state, and charging the battery based on the charging limitation condition.

18 Claims, 12 Drawing Sheets

(56) References Cited

U.S. PATENT DOCUMENTS

| | | | | |
|---|---|---|---|---|
| 2013/0221903 A1* | 8/2013 | Hwang | ............... | H02J 7/045 |
| | | | | 320/107 |
| 2013/0320989 A1 | 12/2013 | Inoue et al. | | |
| 2016/0006286 A1* | 1/2016 | Khandelwal | ............ | H02J 7/007 |
| | | | | 320/162 |

FOREIGN PATENT DOCUMENTS

| | | | |
|---|---|---|---|
| JP | 2017-143026 A | 8/2017 |
| KR | 10-2013-0120227 A | 11/2013 |
| KR | 10-1408307 B1 | 6/2014 |
| KR | 10-1481215 B1 | 1/2015 |
| KR | 10-2016-0119293 A | 10/2016 |
| KR | 10-2018-0031206 A | 3/2018 |
| KR | 10-2018-0056238 A | 5/2018 |

* cited by examiner

FIG. 5

| Current (A) | Negative electrode potential (V) | Negative electrode concentration | Positive electrode concentration | Cell potential (V) |
|---|---|---|---|---|
| 5.61 | AP1 | 0.9 | 0.26 | 4.2 |
| 5.28 | AP1 | 0.9 | 0.26 | 4.2 |
| 4.95 | AP2 | 0.9 | 0.26 | 4.2 |
| 4.62 | AP2 | 0.9 | 0.26 | 4.2 |
| 4.29 | 0.019 | AC | 0.26 | 4.2 |
| 3.96 | 0.019 | AC | 0.26 | 4.2 |
| 3.63 | 0.019 | 0.95 | CC | 4.2 |
| 3.3 | 0.019 | 0.95 | 0.26 | CP |
| 2.97 | 0.019 | 0.95 | 0.26 | CP |
| 2.64 | 0.019 | 0.95 | 0.26 | CP |
| 2.31 | 0.019 | 0.95 | 0.26 | 4.2 |

FIG. 7B

|          | AP1   | AP2  | AC    | CC    | CP   |
|----------|-------|------|-------|-------|------|
| DOE#15'  | 0.018 | 0.02 | 0.534 | 0.399 | 4.17 |
| DOE#15'-2 | 0.018 | 0.02 | 0.534 | 0.38  | 4.16 |
| DOE#15'-3 | 0.018 | 0.02 | 0.524 | 0.399 | 4.18 |
| DOE#15'-4 | 0.018 | 0.02 | 0.544 | 0.38  | 4.16 |

CHARGING METHOD AND APPARATUS OPTIMIZED BASED ON ELECTROCHEMICAL MODEL

CROSS-REFERENCE TO RELATED APPLICATION

This application claims the benefit under 35 USC § 119(a) of Korean Patent Application No. 10-2018-0117009 filed on Oct. 1, 2018 in the Korean Intellectual Property Office, the entire disclosure of which is incorporated herein by reference for all purposes.

BACKGROUND

1. Field

The following description relates to a charging method and apparatus optimized based on an electrochemical model.

2. Description of Related Art

A secondary cell or a storage battery refers to a device which stores external electrical energy in a form of chemical energy and produces electricity when necessary. Among such cells or batteries, a lithium-ion battery is a type of secondary cell which is widely used as a battery for mobile devices and electric vehicles.

A battery is charged using various charging schemes. For example, a multi-step charging scheme charges a battery with multi-step constant current (CC) from a high current to a low current, and a pulse charging scheme continually applies instantaneous pulse current.

Recently, a constant current-constant voltage (CC-CV) charging scheme, which charges a battery with constant voltage until a preset low current value is reached, has been widely used. CC-CV charging requires a great amount of charging time under a constant voltage (CV) condition and thus, is not suitable for fast charging.

To overcome the above issue, an experience-based multi-step charging scheme and the pulse charging scheme has been implemented. However, when a charging scheme which is based on only on the experience-based multi-step charging scheme is used without discerning an internal state of a battery, charging time may not be reduced, and the lifetime of the battery may not increase.

SUMMARY

This Summary is provided to introduce a selection of concepts in a simplified form that are further described below in the Detailed Description. This Summary is not intended to identify key features or essential features of the claimed subject matter, nor is this Summary intended to be used as an aid in determining the scope of the claimed subject matter.

In one general aspect, a charging method includes estimating an internal state of a battery, determining a charging limitation condition corresponding to a plurality of charging areas of the battery based on the estimated internal state of the battery, and charging the battery based on the determined charging limitation condition.

The determining of the charging limitation condition may include generating the plurality of charging areas of the battery based on the estimated internal state of the battery, and extracting, in parallel, charging limitation conditions corresponding to the plurality of charging areas of the battery among a plurality of charging limitation conditions.

The generating of the plurality of charging areas may include generating the plurality of charging areas based on a capacity retention rate of the battery.

The extracting of the charging limitation conditions may include generating a look-up table (LUT) corresponding to the plurality of charging areas based on an aging rate of the battery.

The LUT may include any one or any combination of a charging current, a negative electrode potential, a negative electrode concentration, a positive electrode concentration, and a cell potential.

The generating of the LUT may include extracting a plurality of candidate LUTs which satisfy a preset charging condition, calculating the aging rate of the battery corresponding to the plurality of candidate LUTs, extracting correlations between the aging rate of the battery and the candidate LUTs, and extracting a target LUT based on the extracted correlations.

The extracting of the plurality of candidate LUTs may include extracting the plurality of candidate LUTs which satisfy a preset charging time and a preset charging capacity.

The calculating of the change in the aging rate of the battery may include calculating the change in the aging rate of the battery based on a first negative electrode potential and a second negative electrode potential included in the candidate LUTs.

The extracting of the target LUT may include extracting an LUT which minimizes the aging rate of the battery as the target LUT.

In another general aspect, a charging apparatus includes a receiver configured to receive information related to a battery, and a processor configured to estimate an internal state of the battery, determine a charging limitation condition which corresponds to a plurality of charging areas of the battery based on the estimated internal state of the battery, and charge the battery based on the determined charging limitation condition.

The processor may be configured to generate the plurality of charging areas of the battery based on the estimated internal state of the battery, and extract, in parallel, charging limitation conditions corresponding to the plurality of charging areas of the battery among a plurality of charging limitation conditions.

The processor may be configured to generate the plurality of charging areas based on a capacity retention rate of the battery.

The processor may be configured to generate a look-up table (LUT) corresponding to the plurality of charging areas based on an aging rate of the battery.

The LUT may include any one or any combination of a charging current, a negative electrode potential, a negative electrode concentration, a positive electrode concentration, and a cell potential.

The processor may be configured to extract a plurality of candidate LUTs which satisfy a preset charging condition, calculate the aging rate of the battery corresponding to the plurality of candidate LUTs, extract correlations between the aging rate of the battery and the candidate LUTs, and extract a target LUT based on the extracted correlations.

The processor may be configured to extract a plurality of candidate LUTs which satisfy a preset charging time and a preset charging capacity.

The processor may be configured to calculate a change in the aging rate of the battery based on the plurality of candidate LUTs.

The processor may be configured to calculate the change in the aging rate of the battery based on a first negative electrode potential and a second negative electrode potential included in the candidate LUTs.

The processor may be configured to extract an LUT which minimizes the aging rate of the battery as the target LUT.

Other features and aspects will be apparent from the following detailed description, the drawings, and the claims.

BRIEF DESCRIPTION OF THE DRAWINGS

FIG. 5 illustrates an example of a look-up table (LUT);

FIG. 7B illustrates an example of the charging limitation conditions used in the example of FIG. 7A;

Figure 1:
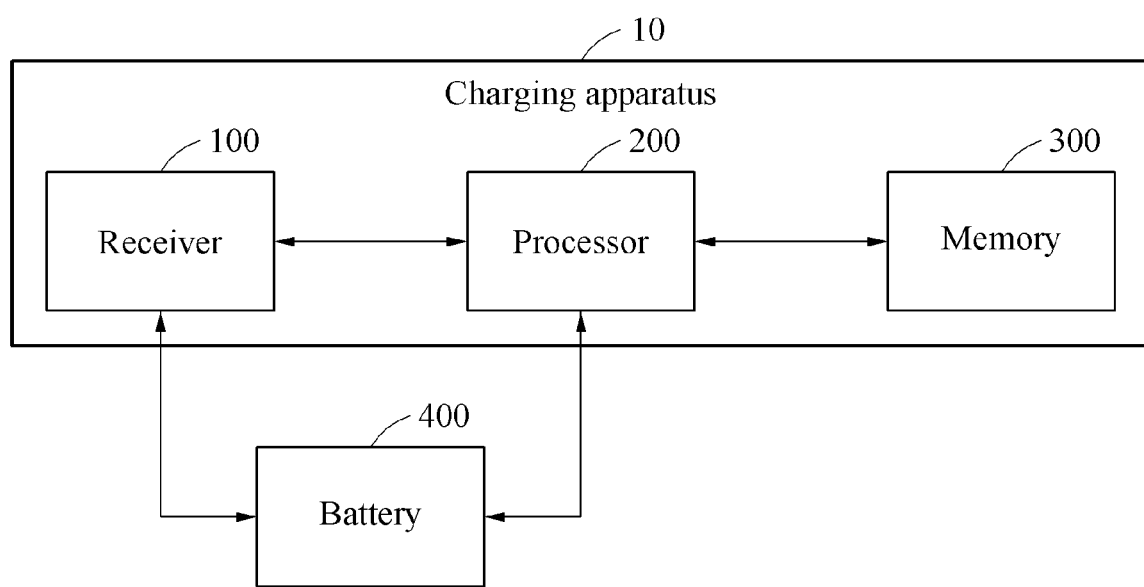
FIG. 1 illustrates an example of a charging apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Terms such as first, second, A, B, (a), (b), and the like may be used herein to describe components. Each of these terminologies is not used to define an essence, order, or sequence of a corresponding component but used merely to distinguish the corresponding component from other component(s). For example, a first component may be referred to as a second component, and similarly the second component may also be referred to as the first component.

It should be noted that if it is described in the specification that one component is "connected," "coupled," or "joined" to another component, a third component may be "connected," "coupled," and "joined" between the first and second components, although the first component may be directly connected, coupled or joined to the second component. In addition, it should be noted that if it is described in the specification that one component is "directly connected" or "directly joined" to another component, a third component may not be present therebetween. Likewise, expressions, for example, "between" and "immediately between" and "adjacent to" and "immediately adjacent to" may also be construed as described in the foregoing.

The terminology used herein is for the purpose of describing particular examples only and is not expected to be limiting of the examples. For example, as used herein, the singular forms "a", "an", and "the" are intended to include the plural forms as well, unless the context clearly indicates otherwise. It will be further understood that the terms "comprises", "comprising", "includes" and/or "including" when used herein, specify the presence of stated features, integers, steps, operations, elements, and/or components or one or more combinations/groups thereof in one or more example embodiments, but do not preclude the presence or addition of one or more other features, integers, steps, operations, elements, components, and/or combinations/groups thereof in alternative embodiments, nor the lack of such stated features, integers, operations, elements, and/or components, and/or combinations/groups in further alternative embodiments unless the context and understanding of the present disclosure indicates otherwise.

Unless otherwise defined, all terms including technical and scientific terms used herein have the same meaning as commonly understood by one of ordinary skill in the art to which this disclosure pertains based on an understanding of the present disclosure. It will be further understood that terms, such as those defined in commonly-used dictionaries, should be interpreted as having a meaning that is consistent with their meaning in the context of the relevant art and the present disclosure, and will not be interpreted in an idealized or overly formal sense unless expressly so defined herein.

When describing the examples with reference to the accompanying drawings, like reference numerals refer to like constituent elements and a repeated description related thereto will be omitted. In the description of examples, detailed description of well-known related structures or functions will be omitted when it is deemed that such description will cause ambiguous interpretation of the present disclosure.

FIG. 1 illustrates an example of a charging apparatus.

Referring to FIG. 1, a charging apparatus 10 charges a battery 400. The charging apparatus 10 may fast charge the battery 400 based on an electrochemical model.

The charging apparatus 10 receives information related to the battery 400 from the battery 400, and fast charges the battery 400 while minimizing aging based on the information related to the battery 400.

The charging apparatus 10 estimates an internal state of the battery 400 based on the electrochemical model, and minimizes charging deterioration through multi-step charging.

The charging apparatus 10 may be implemented as a system on chip (SoC), an integrated circuit (IC), or a printed circuit board (PCB) such as a motherboard. For example, the charging apparatus 10 is implemented as an application processor.

Further, the charging apparatus 10 may be implemented in a personal computer (PC), a data server, or a portable device, but is not limited thereto.

The portable device may be implemented as a laptop computer, a mobile phone, a smart phone, a tablet PC, a mobile internet device (MID), a personal digital assistant (PDA), an enterprise digital assistant (EDA), a digital still camera, a digital video camera, a portable multimedia player (PMP), a personal navigation device or portable navigation device (PND), a handheld game console, an e-book, or a smart device, as examples. The smart device may be implemented as a smart watch, a smart band, or a smart ring.

The charging apparatus 10 may include a receiver 100, a processor 200, and a memory 300.

The receiver 100 receives the information related to the battery 400. The information includes electrical information and physical information related to the battery 400. For example, the information related to the battery 400 includes a current flowing in the battery 400, an electric charge existing in the battery 400, and a temperature of the battery 400.

The processor 200 controls an overall operation of the charging apparatus 10. The processor 200 may be implemented by at least one processor including at least one core.

The processor 200 generates a charging limitation condition for electrochemical model-based fast charging, and charges a battery using the generated charging limitation condition.

The processor 200 writes or records at least one piece of information, which is necessary for charging, in the memory 300 or another memory (not shown), for example, an internal register, an internal cache, or a storage.

The processor 200 estimates the internal state of the battery 400. The internal state of the battery 400 includes a state of charge (SOC) and a state of health (SOH) of the battery 400, but is not limited thereto.

The processor 200 determines charging limitation conditions corresponding to a plurality of charging areas based on the internal state of the battery 400. The charging limitation condition includes various parameters used to charge the battery 400.

For example, the charging limitation condition includes electrical conditions needed for charging, such as a charging current, a charging voltage, and a charging time.

The processor 200 generates the plurality of charging areas based on the estimated internal state. The charging areas refer to areas obtained by partitioning the internal state of the battery 400 into predetermined sections to apply the charging limitation condition. For example, the charging areas include SOH areas of the battery 400.

The processor 200 generates the plurality of charging areas based on a capacity retention rate of the battery 400. For example, the processor 200 generates the plurality of charging areas by partitioning the SOH area of the battery 400 based on a slope of a capacity retention rate graph.

The processor 200 extracts charging limitation conditions corresponding to the plurality of charging areas in parallel among a plurality of charging limitation conditions.

In detail, the processor 200 generates a look-up table (LUT) corresponding to the plurality of charging areas based on an aging rate of the battery 400. For example, the LUT may include any one or any combination of a charging current, a negative electrode potential, a negative electrode concentration, a positive electrode concentration, and a cell potential. In addition, the LUT further includes physical information which affects charging of the battery 400.

The processor 200 extracts a plurality of candidate LUTs satisfying a preset charging condition. In detail, the processor 200 extracts a plurality of candidate LUTs satisfying a preset charging time and a preset charging capacity.

The processor 200 calculates the aging rate of the battery 400 corresponding to the plurality of candidate LUTs. The aging rate refers to a degree of deterioration per cycle. The processor 200 extracts correlations between the aging rate and the candidate LUTs.

In detail, the processor 200 extracts the correlations by calculating a change in the aging rate of the battery 400 according to the candidate LUTs. For example, the processor 200 diagrams and calculates the change in the aging rate of the battery 400 according to the candidate LUTs.

The processor 200 calculates the change in the aging rate based on a first negative electrode potential and a second negative electrode potential included in the candidate LUTs. The processor 200 calculates the change in the aging rate of the battery 400 while suitably changing factors included in the candidate LUTs, in addition to the negative electrode potentials.

The processor 200 extracts a target LUT based on correlations between the aging rate of the battery 400 and the candidate LUTs. For example, the processor 200 extracts an LUT minimizing the aging rate as the target LUT.

The processor 200 determines the target LUT to be an optimal charging limitation condition. The processor 200 charges the battery 400 based on the determined charging limitation condition.

The memory 300 stores data generated by the processor 200. For example, the data generated by the processor 200 includes information related to the battery 400, the charging limitation condition for the battery 400, and the internal state of the battery 400.

Hereinafter, an operation of the charging apparatus 10 will be described in detail with reference to FIGS. 2 through 10.

Figure 2:
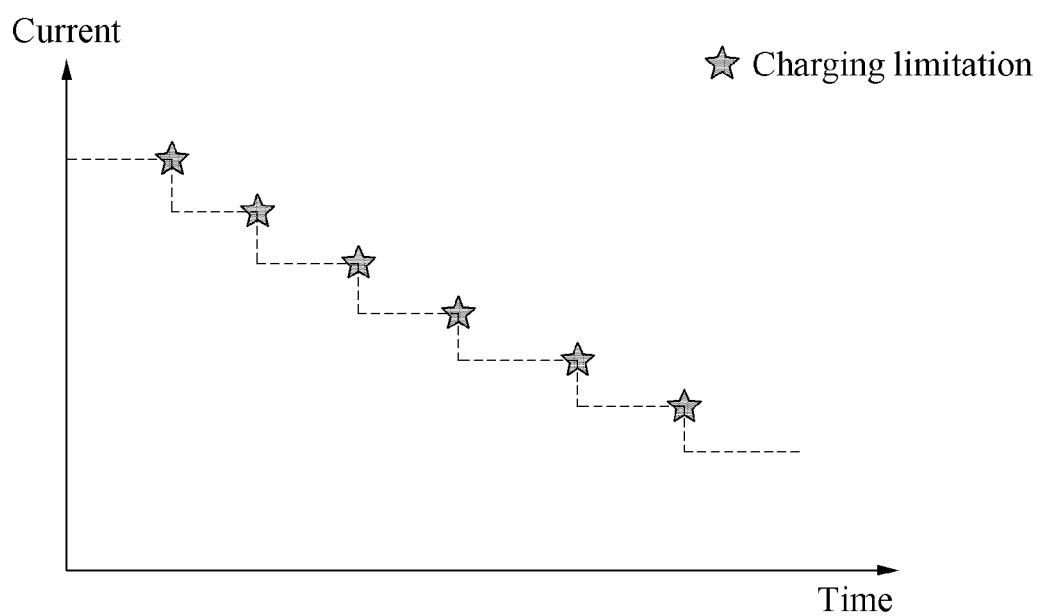
FIG. 2 illustrates an example of a charging limitation condition which changes over time.
Figure 3:
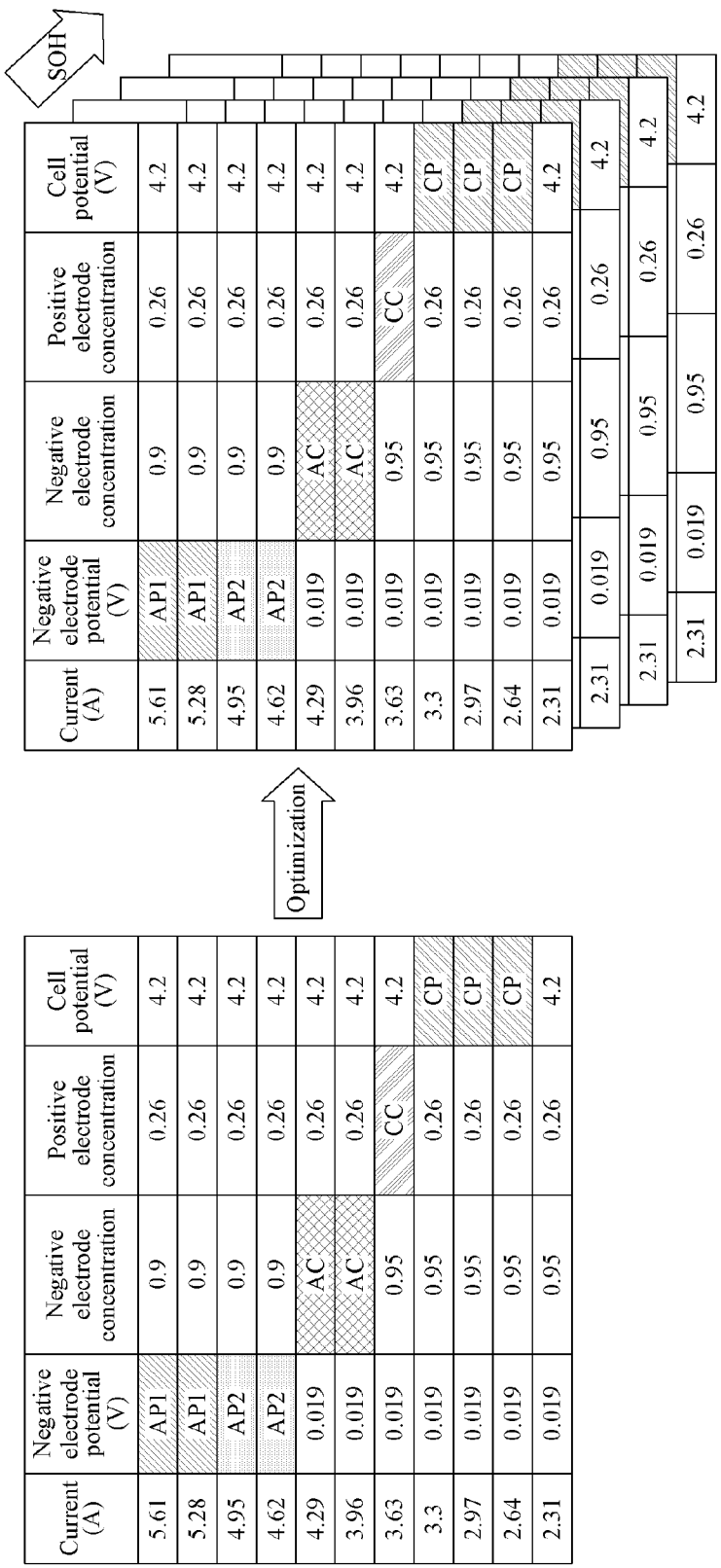
FIG. 3 illustrates an example of an operation of the charging apparatus of FIG. 1.

FIG. 2 illustrates an example of a charging limitation condition which changes over time, and FIG. 3 illustrates an example of an operation of the charging apparatus of FIG. 1.

Referring to FIGS. 2 and 3, the charging apparatus 10 charges the battery 400 using a different charging limitation condition depending on a charging area. For example, the charging apparatus 10 charges the battery 400 using different currents over periods of time.

The charging apparatus 10 estimates a physical internal state of the battery 400 and determines the charging limitation condition using the estimated internal state. That is, the charging apparatus 10 efficiently charges the battery 400 by applying a suitable charging limitation condition based on the internal state of the battery 400.

Unlike existing charging schemes, the charging apparatus 10 partitions the charging area and optimizes the charging limitation condition based on an aging rate of the battery 400 according to a plurality of charging limitation conditions with respect to a plurality of charging areas.

For example, the charging apparatus 10 partitions the charging area into a plurality of SOH areas based on SOH values, and sets an LUT corresponding to an optimal charging limitation condition by analyzing a correlation between the charging limitation condition and the aging rate with respect to each SOH area.

An aging mechanism of the battery 400 changes depending on an SOH area. Thus, the charging apparatus 10 improves the life of the battery 400 by applying a charging limitation condition suitable for a different aging mechanism.

Further, the charging apparatus 10 performs a feedback optimization in parallel with respect to each SOH area, thereby reducing a time for developing and deriving a charging condition of the battery 400.

The charging apparatus 10 may extract an optimal LUT as the target LUT by analyzing the correlation between the aging rate and the charging limitation condition. Existing theoretical/intuitive LUT deriving schemes have an issue that whether a life characteristic is optimized cannot be known.

However, unlike the existing schemes, the charging apparatus 10 experimentally derives an optimum point of the life characteristic through feedbacks by analyzing the correlation between the aging rate and the charging limitation condition derived experimentally.

Figure 4:
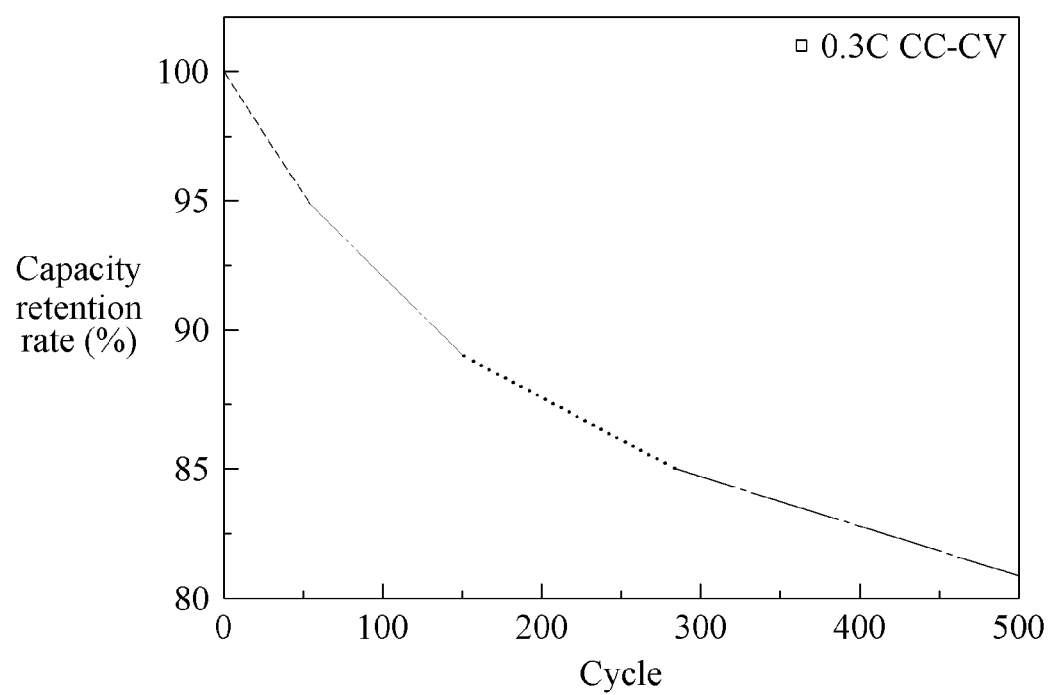
FIG. 4 illustrates an example of generating a plurality of charging areas.

FIG. 4 illustrates an example of generating a plurality of charging areas.

Referring to FIG. 4, the processor 200 generates a plurality of charging areas based on an internal state of the battery 400. The processor 200 generates the plurality of charging areas based on a capacity retention rate of the battery 400. For example, the processor 200 generates the plurality of charging areas using a capacity retention rate graph for 0.3 CC/CV charging.

In the example of FIG. 4, the processor 200 generates the plurality of charging areas by partitioning a charging area based on a slope of the capacity retention rate with respect to a charging/discharging cycle. For example, the processor 200 generates the plurality of charging areas by partitioning the charging area into a plurality of SOH areas based on SOHs 100~95, ~90, ~85, and ~80% of the battery 400.

FIG. 5 illustrates an example of an LUT.

Referring to FIG. 5, the processor 200 extracts charging limitation conditions corresponding to a plurality of charging areas. The charging limitation conditions extracted by the processor 200 includes a form of an LUT.

The processor 200 selects a range and a level of each of a plurality of charging limitation conditions. The processor 200 derives LUTs satisfying a charging condition among a plurality of LUTs. For example, the processor 200 derives LUTs satisfying a charging time and a charging capacity among the plurality of LUTs.

An LUT includes charging limitation conditions for internal states of the battery 400 based on an electrochemical model and a charging current for each charging step. The processor 200 generates various LUTs by changing only some charging parameters, for example, AP1, AP2, AC, CC, and CP, while fixing the other charging parameters.

In an example, the processor 200 derives 24 LUTs satisfying the charging time and the charging capacity among 3125 LUTs.

Further, the processor 200 performs a capacity retention rate experiment with respect to a plurality of SOH areas. The processor 200 calculates an aging rate according to an LUT with respect to each SOH area through the experiment.

The LUT includes various parameters used for charging. In the example of FIG. 5, the LUT includes a current, a negative electrode potential, a negative electrode concentration, a positive electrode concentration, and a cell potential. The LUT is not limited to the example of FIG. 5, and may include other parameters which affect charging of the battery 400.

Figure 6A:
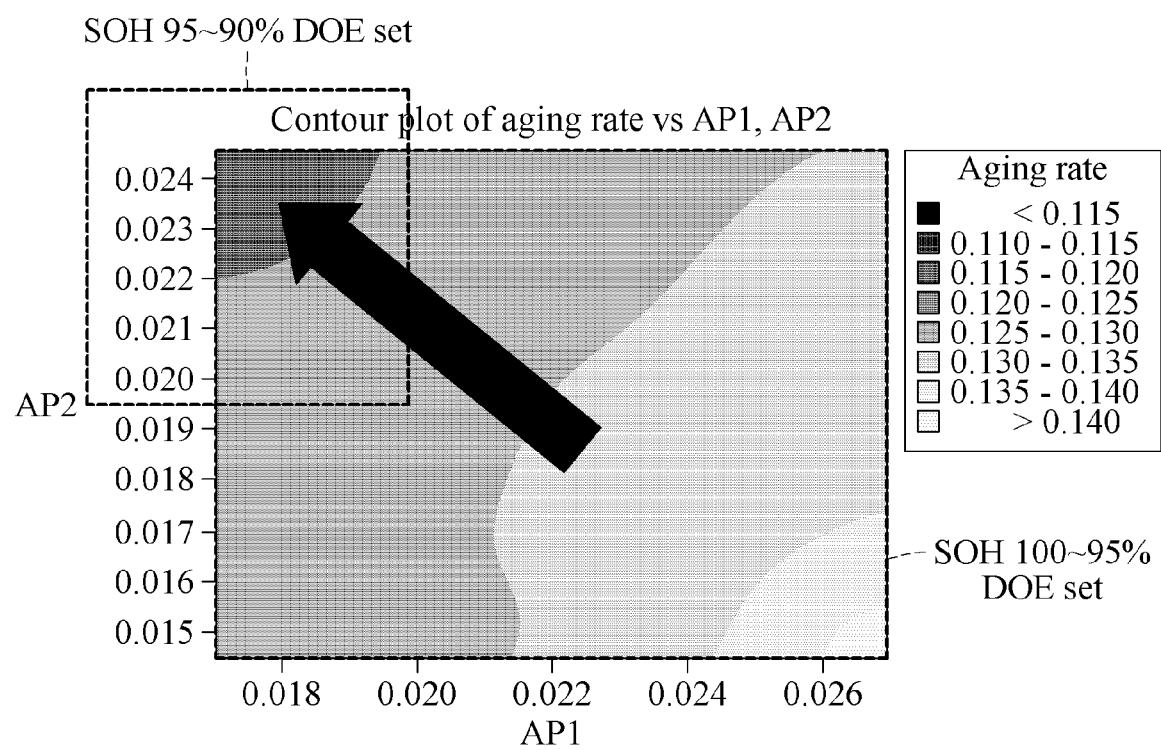
FIG. 6A illustrates an example of a correlation between a negative electrode potential and an aging rate of a battery.
Figure 6B:
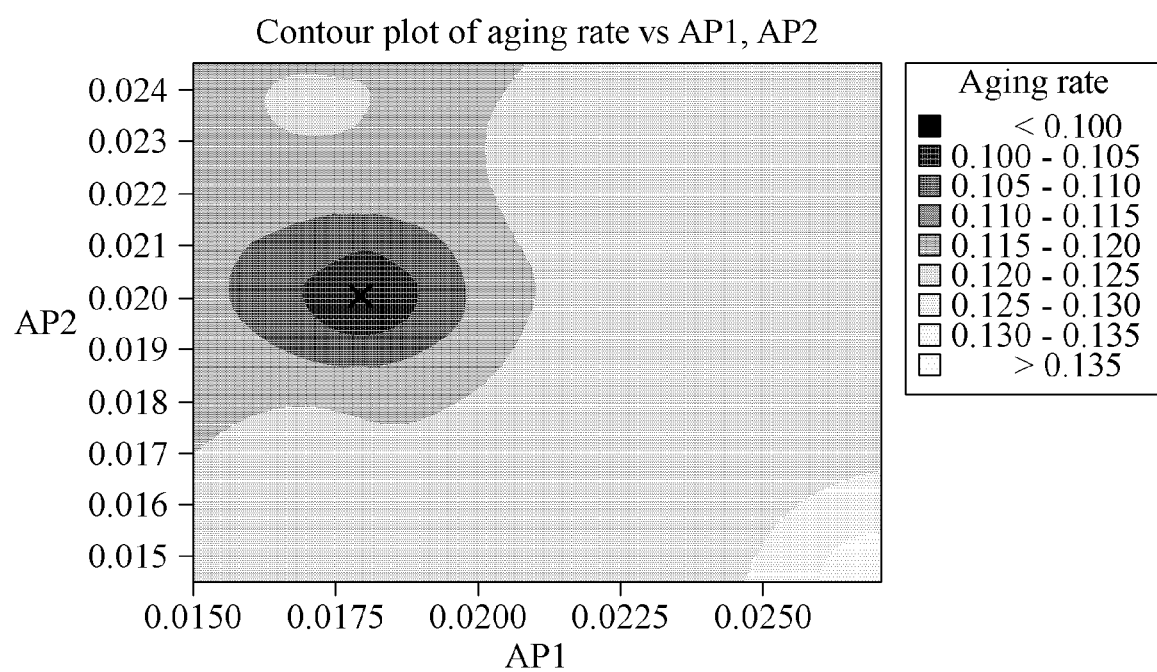
FIG. 6B illustrates an example of a correlation between a negative electrode potential and an aging rate of a battery.

The processor 200 derives a capacity retention rate of the battery 400 by adjusting parameters other than the current value, based on the current value of the LUT. In the example of FIG. 5, and FIGS. 6A and 6B, AP1 has five values in a range of 0.017 volts (V) to 0.027 V, and AP2 has five values in a range of 0.0145 V to 0.0245 V (not shown).

AC has five values in a range of 0.484 to 0.584, CC has five values in a range of 0.349 to 0.449, and CP has five values in a range of 4.17 to 4.2 (not shown).

FIG. 6A illustrates an example of a correlation between a negative electrode potential and an aging rate of a battery, and FIG. 6B illustrates an example of a correlation between a negative electrode potential and an aging rate of a battery.

Referring to FIGS. 6A and 6B, the processor 200 calculates an aging rate of the battery 400 corresponding to a plurality of candidate LUTs, and analyzes correlations between the aging rate and the plurality of candidate LUTs.

In detail, the processor 200 calculates the aging rate while changing a charging limitation condition by changing the plurality of candidate LUTs. For example, the processor 200 calculates the aging rate of the battery 400 while changing negative electrode potentials, for example, AP1 and AP2 of FIG. 5.

A contour plot of FIG. 6A shows that the aging rate decreases as AP1 decreases and AP2 increases. The processor 200 continually calculates the aging rate while changing the plurality of candidate LUTs with respect to the plurality of charging areas.

The processor 200 calculates a correlation with the aging rate with respect to a candidate LUT, additionally extracts another LUT, and analyzes a correlation with the aging rate with respect to the additionally extracted LUT. For example, the processor 200 additionally extracts an LUT based on a result of FIG. 6A and analyzes a correlation with the aging rate, thereby obtaining a contour plot as shown in FIG. 6B.

The processor 200 calculates the aging rate using 24 design of experiment (DOE) sets with respect to an SOH area of 95~90%, which is one of the charging areas. In this example, in an SOH area of 100~95%, the range and the level of the charging limitation condition are corrected while maintaining top eight DOE sets.

The range and the level of the charging limitation condition may be corrected by changing charging parameters of the LUT. For example, the processor 200 may add 16 charging limitation conditions satisfying the charging time and the charging capacity to 1323 charging limitation conditions and analyze correlations with the aging rate.

Through the above process, the processor 200 calculates the correlations between the aging rate and the charging limitation conditions. The processor 200 may diagram contour plots as shown in the examples of FIGS. 6A and 6B, thereby deriving a charging limitation condition with a relatively low aging rate and a relatively excellent charging rate.

In the examples of FIGS. 6A and 6B, a relatively dark portion is a location at which the aging rate is relatively low.

The processor 200 derives a charging limitation condition with a relatively low aging rate based on the contour plots. For example, the processor 200 diagrams the contour plots with respect to the aging rate while changing negative electrode potential values AP1 and AP2.

In an example, the processor 200 may derive a charging limitation condition minimizing the aging rate by analyzing correlations between the aging rate and various charging parameters such as a positive electrode potential, a negative electrode concentration, and a cell potential in addition to the negative electrode potential.

In an example, the processor 200 may perform an optimization with respect to some of the charging parameters and then perform an optimization with respect to remaining parameters, thereby deriving an optimal charging limitation condition.

In an example, the processor 200 extracts a plurality of LUTs by experimentally analyzing correlations with the aging rate with respect to a first set of charging areas, and analyze correlations with the aging rate with respect to a second set of charging areas based on the extracted LUTs. Further, the processor 200 may extract an optimal charging limitation condition corresponding to the plurality of charging areas in parallel.

Figure 7A:
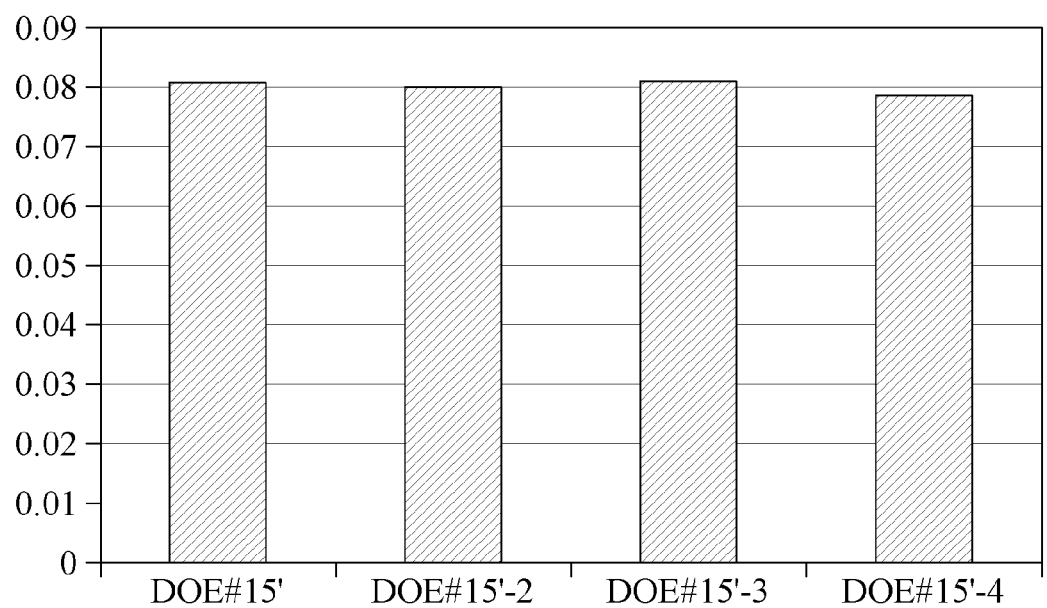
FIG. 7A illustrates an example of correlations between various charging limitation conditions and an aging rate.

FIG. 7A illustrates an example of correlations between various charging limitation conditions and an aging rate, and FIG. 7B illustrates an example of the charging limitation conditions used in the example of FIG. 7A.

Referring to FIGS. 7A and 7B, FIG. 7A shows aging rates for four experiment conditions. FIG. 7B shows the charging limitation conditions used in the example of FIG. 7A. In the example of FIG. 7A, DOE #15'-4 exhibits the lowest aging rate.

Figure 8:
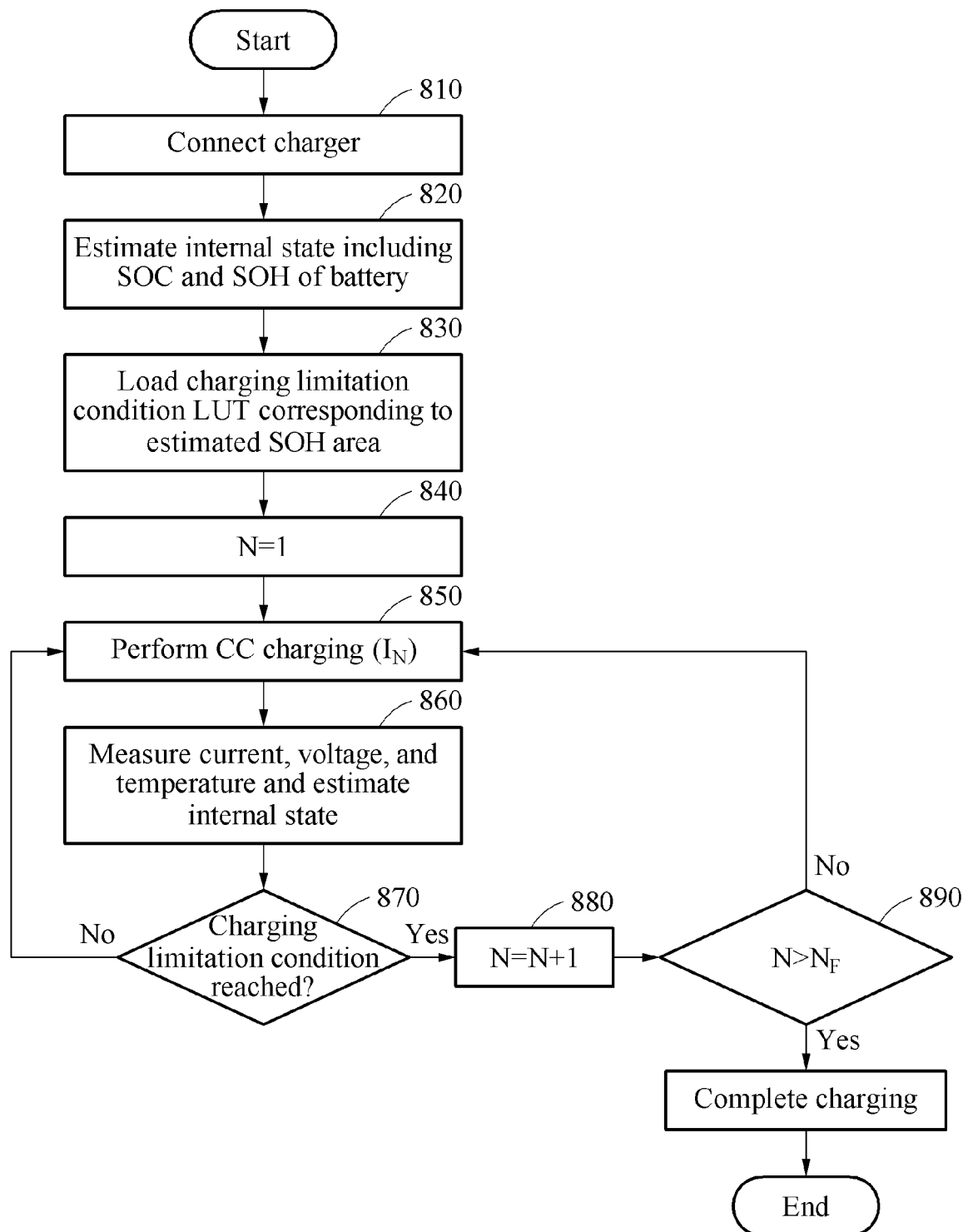
FIG. 8 illustrates an example of a charging operation of the charging apparatus of FIG. 1.

FIG. 8 illustrates an example of a charging operation of the charging apparatus of FIG. 1.

The operations in FIG. 8 may be performed in the sequence and manner as shown, although the order of some operations may be changed or some of the operations omitted without departing from the spirit and scope of the illustrative examples described. Many of the operations shown in FIG. 8 may be performed in parallel or concurrently. One or more blocks of FIG. 8, and combinations of the blocks, can be implemented by special purpose hardware-based computer that perform the specified functions, or combinations of special purpose hardware and computer instructions. In addition to the description of FIG. 8 below, in an example, the descriptions of FIGS. 1-5, 6A, 6B, 7A, and 7B are also applicable to FIG. 8, and are incorporated herein by reference, noting that examples are not limited thereto. Thus, the above description may not be repeated here.

Referring to FIG. 8, in operation 810, a charger is connected to the battery 400 (FIG. 1), and the charging process is started. In the example of FIG. 8, an LUT included in a charging limitation condition includes an optimized target LUT. For example, a charging limitation condition LUT refers to a target LUT corresponding to a plurality of charging areas.

In operation 820, the processor 200 estimates an internal state of the battery including an SOC and an SOH of the battery. In operation 830, the processor 200 loads a charging limitation condition LUT corresponding to an estimated SOH area.

The charging limitation condition LUT includes the charging limitation condition that is based on the internal state of the battery 400 and a charging current for each charging step. A process of deriving the charging limitation condition will be described in detail with reference to FIG. 9.

In operation 840, the processor 200 assigns the value "1" to N. Thereafter, the processor 200 performs charging with a constant current IN. For example, the processor 200 applies a charging current with an intensity of $I_1$ at a first stage. In operation 860, the processor 200 measures a current flowing in the battery 400, a voltage applied to the battery 400, and a temperature of the battery 400, and estimates the internal state of the battery 400 while charging is being performed.

In operation 870, the processor 200 determines whether the charging limitation condition is reached based on the current, the voltage, the temperature, and the internal state of the battery 400. In this example, if the charging limitation condition is not reached, CC charging is performed again, in operation 850. If the charging limitation condition is reached, N+1 is assigned to N, in operation 880.

The processor 200 applies a current $I_2$ of a subsequent step when any one of the various parameters included in the charging limitation condition reaches the charging limitation condition. In this example, the processor 200 determines an intensity of the charging current to satisfy $I_{N+1} < I_N$.

In operation 890, the processor 200 determines whether N is greater than $N_F$. If N is not greater than $N_F$, CC charging is performed again, in operation 850. If N is greater than $N_F$, charging is completed.

Figure 9:
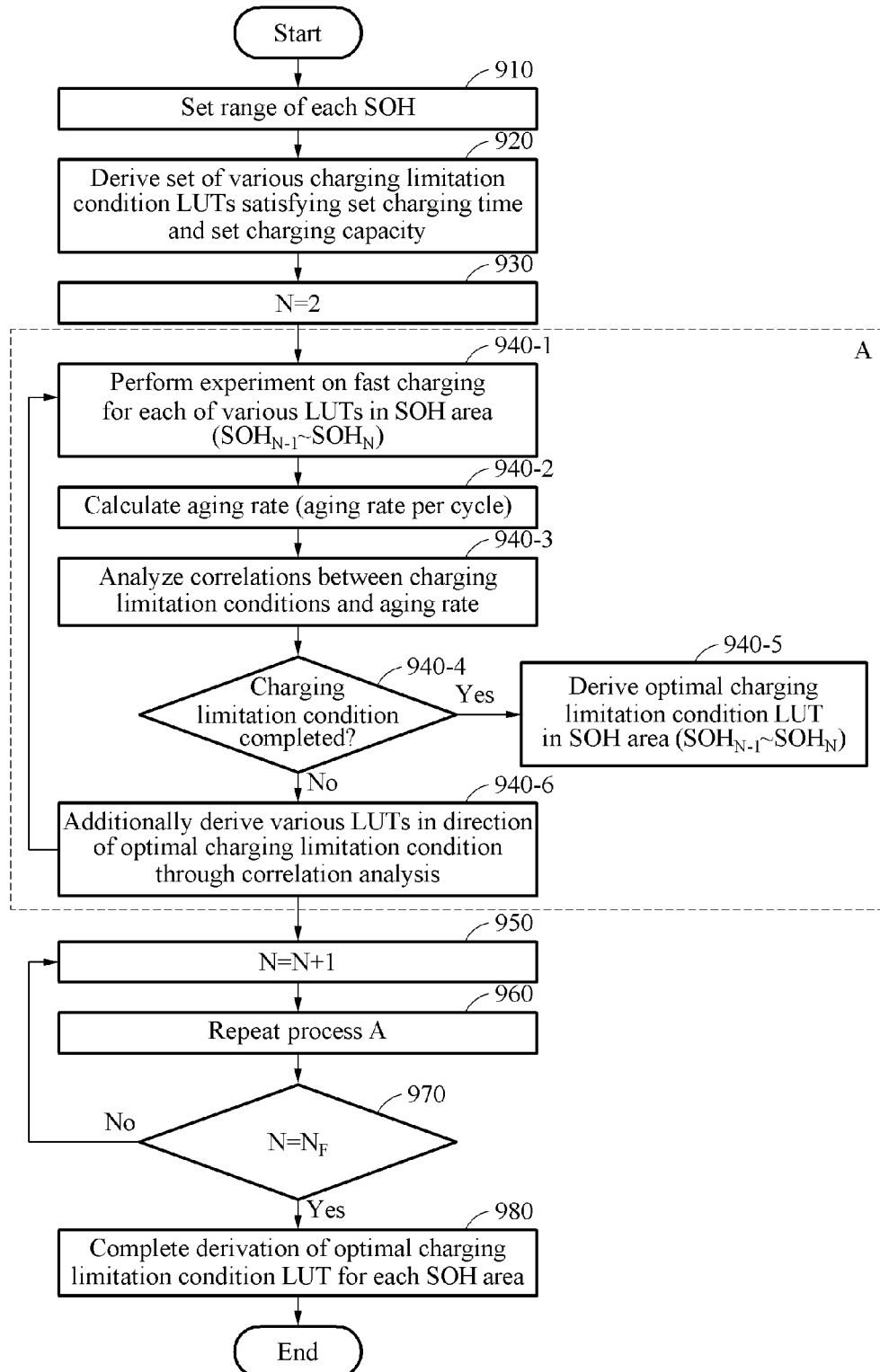
FIG. 9 illustrates an example of extracting a target LUT by the charging apparatus of FIG. 1.

FIG. 9 illustrates an example of extracting a target LUT by the charging apparatus of FIG. 1.

The operations in FIG. 9 may be performed in the sequence and manner as shown, although the order of some operations may be changed or some of the operations omitted without departing from the spirit and scope of the illustrative examples described. Many of the operations shown in FIG. 9 may be performed in parallel or concurrently. One or more blocks of FIG. 9, and combinations of the blocks, can be implemented by special purpose hardware-based computer that perform the specified functions, or combinations of special purpose hardware and computer instructions. In addition to the description of FIG. 9 below, in an example, the descriptions of FIGS. 1-5, 6A, 6B, 7A, and 7B are also applicable to FIG. 9, and are incorporated herein by reference, noting that examples are not limited thereto. Thus, the above description may not be repeated here.

Referring to FIG. 9, the processor 200 derives an optimal charging limitation condition with respect to a plurality of charging areas. For example, the processor 200 derives an optimal charging limitation condition for each of a plurality of SOH areas.

For this, in operation 910, the processor 200 sets a range of each SOH. For example, the processor 200 generates the plurality of charging areas with SOH areas of 100-95%, 95-90%, 90-85%, and 85-80%.

Since an aging factor and an aging mechanism differ for each SOH area even in the same battery 400, the processor 200 sets a different charging limitation condition for each SOH area, thereby securing an improved battery life characteristic when compared to an example of charging all SOH areas with a single charging limitation condition.

In an example, the processor 200 performs a feedback optimization in parallel with respect to the plurality of SOH areas, thereby reducing a time for developing or deriving a charging limitation condition.

The processor 200 derives a plurality of candidate LUTs satisfying a charging condition with respect to the plurality of charging areas. For example, in operation 920, the processor 200 derives candidate LUTs including various charging parameters satisfying a set charging time and a set charging capacity. In operation 930, the value "2" is assigned to N when the charging limitation condition is derived.

In this example, a plurality of LUTs is derived by changing only a first set of charging parameters in the candidate LUTs while fixing a second set of parameters. A number of LUTs satisfying the charging time and the charging capacity may be derived, and thus an electrochemical model-based fast charging simulation may be implemented for efficient derivation.

In operation 940-1, the processor 200 performs an experiment on fast charging with respect to a charging area, for example, $SOH_{N-1} \sim SOH_N$, generated using the derived candidate LUTs. In operation 940-2, the processor 200 calculates an aging rate of the battery based on a result of the experiment. The aging rate of the battery refers to a degree of deterioration per cycle.

As the degree of deterioration, a decrement in capacity retention rate or a decrement in capacity may be used with priority, and an increment in direct current-internal resistance (DC-IR) or an increment in overpotential may be used.

The processor 200 analyzes correlations between various candidate LUTs and the aging rate of the battery. For example, in operation 940-3, the processor 200 analyzes correlations between the charging parameters of the candidate LUTs and the aging rate of the battery. In this example, the processor 200 estimates a charging parameter with a relatively great correlation with the aging rate and a direction of a charging limitation condition minimizing the aging rate.

In operation 940-4, the processor 200 determines whether the charging limitation condition is optimized. In operation 940-5, in response to completion of the optimization, the processor 200 derives an optimal charging limitation condition LUT with respect to the SOH area, for example, $SOH_{N-1} \sim SOH_N$.

In operation 940-6, in response to incompletion of the optimization, the processor 200 additionally derives various LUTs in the direction of the optimal charging limitation condition through a correlation analysis by iteratively performing the process A.

In operation 960, the processor 200 optimizes a charging limitation condition with respect to a second SOH area, for example, $SOH_2 \sim SOH_3$, in the same manner of a first SOH area, by assigning N+1 to N simultaneously while performing the process A, in operation 950.

As described above, the processor 200 performs the optimization process in parallel with respect to the plurality of charging areas at the same time. For example, the processor 200 performs the optimization process in parallel with respect to the plurality of SOH areas at the same time.

In operation 970, the processor 200 determines whether an optimization with respect to a last SOH area is completed, by determining whether N reaches $N_F$. In operation 980, in response to completion of the optimization with respect to the last SOH area, the processor 200 completes derivation of a target LUT for each of the plurality of SOH areas.

Figure 10:
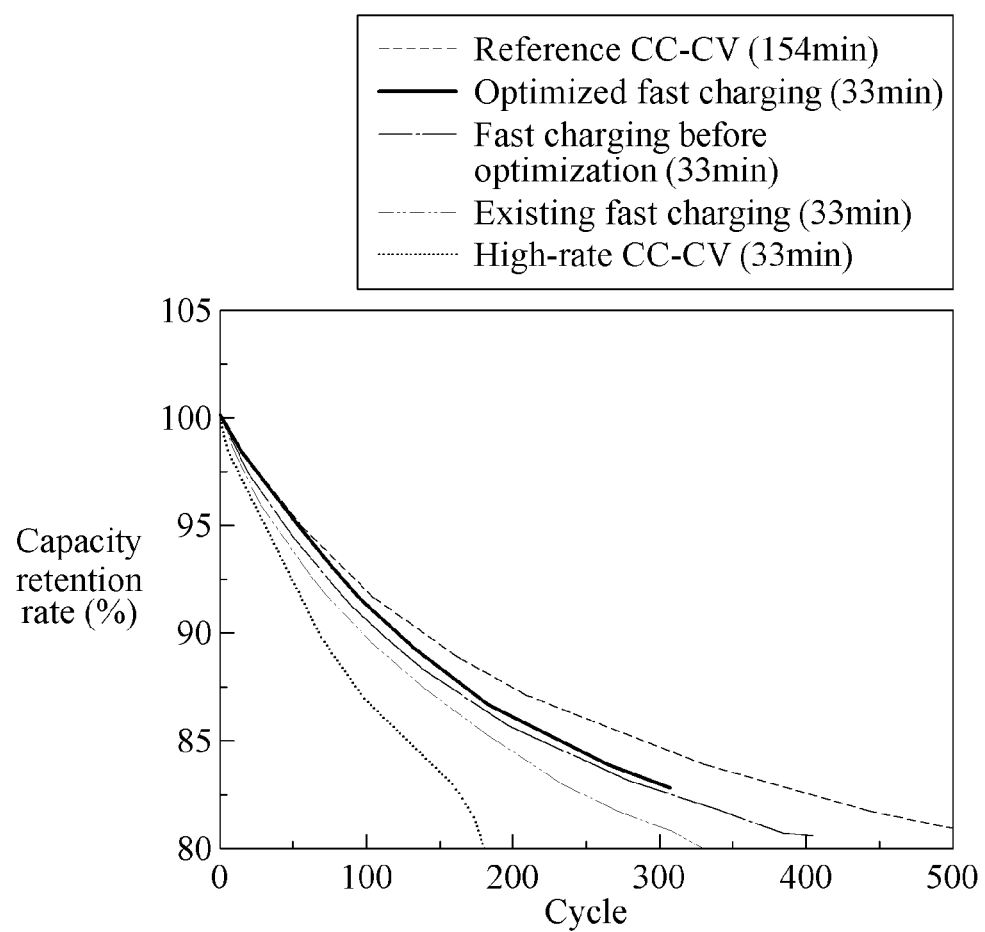
FIG. 10 illustrates an example of capacity retention rates with respect to various charging schemes.

FIG. 10 illustrates an example of capacity retention rates with respect to various charging schemes.

Referring to FIG. 10, the charging apparatus 10 may perform multi-step charging which may minimize charging deterioration by estimating an internal state of the battery 400 based on an electrochemical model. The internal state of the battery 400 may be used as a charging limitation condition, and thus an aging rate of the battery 400 varies depending on an internal state value used for each current step.

The charging apparatus 10 charges the battery 400 by deriving a charging limitation condition which minimizes the aging rate of the battery 400. In detail, the charging apparatus 10 may generate various candidate LUTs satisfying a charging time and a charging capacity, and may calculate the aging rate of the battery by implementing a fast charging scheme with respect to each candidate LUT.

The charging apparatus 10 derives an optimal charging limitation condition by analyzing correlations between the aging rate of the battery and charging limitation conditions. The charging apparatus 10 derives an optimal charging limitation condition for each SOH area, thereby greatly improving a life of a battery.

The charging apparatus 10 improves a capacity retention rate by more than 30% through an optimized fast charging scheme, when compared to existing charging schemes. Further, the charging apparatus 10 may complete a charging process in a relatively short time, when compared to existing CC-CV charging schemes.

A result of comparing the charging apparatus 10 to the existing charging schemes in terms of performance is shown in Table 1.

TABLE 1

| Charging scheme | End of Life (EOL) | Charging time |
| --- | --- | --- |
| CC-CV charging | 178 cycles | 33 min |
| Existing electrochemical model-based charging | 325 cycles | 33 min |
| Charging apparatus | More than 420 cycles | 33 min |

Referring to Table 1, it may be seen that the charging apparatus 10 exhibits an excellent EOL when compared to the existing charging schemes, while having a charging time identical to those of the existing charging schemes.

The charging apparatus 10, other apparatuses, devices, and other components described herein with respect to FIGS. 1-10 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-10 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software include higher-level code that is executed by the one or more processors or computers using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A charging method comprising:
    estimating an internal state of a battery;
    determining a charging limitation condition corresponding to a plurality of charging areas of the battery based on the estimated internal state of the battery;
    charging the battery based on the determined charging limitation condition, and
    extracting, in parallel, charging limitation conditions corresponding to the plurality of charging areas of the battery among a plurality of charging limitation conditions,
    wherein the extracting of the charging limitation conditions comprises generating a look-up table (LUT) corresponding to the plurality of charging areas based on an aging rate of the battery.

2. The charging method of claim 1, wherein the determining of the charging limitation condition comprises:
    generating the plurality of charging areas of the battery based on the estimated internal state of the battery.

3. The charging method of claim 2, wherein the generating of the plurality of charging areas comprises generating the plurality of charging areas based on a capacity retention rate of the battery.

4. The charging method of claim 2, wherein the LUT comprises any one or any combination of a charging current, a negative electrode potential, a negative electrode concentration, a positive electrode concentration, and a cell potential.

5. The charging method of claim 2, wherein the generating of the LUT comprises:
   extracting a plurality of candidate LUTs which satisfy a preset charging condition;
   calculating the aging rate of the battery corresponding to the plurality of candidate LUTs;
   extracting correlations between the aging rate of the battery and the candidate LUTs; and
   extracting a target LUT based on the extracted correlations.

6. The charging method of claim 5, wherein the extracting of the plurality of candidate LUTs comprises extracting the plurality of candidate LUTs which satisfy a preset charging time and a preset charging capacity.

7. The charging method of claim 5, wherein the extracting of the correlations comprises calculating a change in the aging rate of the battery based on the plurality of candidate LUTs.

8. The charging method of claim 7, wherein the calculating of the change in the aging rate of the battery comprises calculating the change in the aging rate of the battery based on a first negative electrode potential and a second negative electrode potential included in the candidate LUTs.

9. The charging method of claim 5, wherein the extracting of the target LUT comprises extracting an LUT which minimizes the aging rate of the battery as the target LUT.

10. A charging apparatus, comprising:
    a receiver configured to receive information related to a battery; and
    a processor configured to estimate an internal state of the battery, determine a charging limitation condition which corresponds to a plurality of charging areas of the battery based on the estimated internal state of the battery, charge the battery based on the determined charging limitation condition, and extract, in parallel, charging limitation conditions corresponding to the plurality of charging areas of the battery among a plurality of charging limitation conditions,
    wherein the processor is configured to generate a look-up table (LUT) corresponding to the plurality of charging areas based on an aging rate of the battery.

11. The charging apparatus of claim 10, wherein the processor is configured to generate the plurality of charging areas of the battery based on the estimated internal state of the battery.

12. The charging apparatus of claim 11, wherein the processor is configured to generate the plurality of charging areas based on a capacity retention rate of the battery.

13. The charging apparatus of claim 11, wherein the LUT comprises any one or any combination of a charging current, a negative electrode potential, a negative electrode concentration, a positive electrode concentration, and a cell potential.

14. The charging apparatus of claim 11, wherein the processor is configured to extract a plurality of candidate LUTs which satisfy a preset charging condition, calculate the aging rate of the battery corresponding to the plurality of candidate LUTs, extract correlations between the aging rate of the battery and the candidate LUTs, and extract a target LUT based on the extracted correlations.

15. The charging apparatus of claim 14, wherein the processor is configured to extract a plurality of candidate LUTs which satisfy a preset charging time and a preset charging capacity.

16. The charging apparatus of claim 14, wherein the processor is configured to calculate a change in the aging rate of the battery based on the plurality of candidate LUTs.

17. The charging apparatus of claim 16, wherein the processor is configured to calculate the change in the aging rate of the battery based on a first negative electrode potential and a second negative electrode potential included in the candidate LUTs.

18. The charging apparatus of claim 14, wherein the processor is configured to extract an LUT which minimizes the aging rate of the battery as the target LUT.

* * * * *